United States Patent
Shin et al.

(10) Patent No.: US 7,852,656 B2
(45) Date of Patent: Dec. 14, 2010

(54) ONE-TIME PROGRAMMABLE CELL AND MEMORY DEVICE HAVING THE SAME

(75) Inventors: Chang-Hee Shin, Chungcheongbuk-do (KR); Ki-Seok Cho, Chungcheongbuk-do (KR)

(73) Assignee: MagnaChip Semiconductor Ltd., Chungcheongbuk-do (KR)

( * ) Notice: Subject to any disclaimer, the term of this patent is extended or adjusted under 35 U.S.C. 154(b) by 286 days.

(21) Appl. No.: 12/071,127

(22) Filed: Feb. 15, 2008

(65) Prior Publication Data

US 2008/0198643 A1    Aug. 21, 2008

(30) Foreign Application Priority Data

Feb. 16, 2007    (KR) .................. 10-2007-0016545

(51) Int. Cl.
*G11C 17/00*    (2006.01)
(52) U.S. Cl. .................. 365/94; 365/63; 365/225.7
(58) Field of Classification Search .................. 365/94, 365/63, 225.7
See application file for complete search history.

(56) References Cited

U.S. PATENT DOCUMENTS 6,927,997 B2 *   8/2005   Lee et al. .................. 365/177
2008/0159042 A1 *   7/2008   Bertin et al. .............. 365/225.7

FOREIGN PATENT DOCUMENTS

| KR | 05-266682 | 10/1993 |
| KR | 10-2003-0002156 | 1/2003 |
| KR | 2005-0001966 | 1/2005 |
| KR | 10-2005-0073747 | 7/2005 |

* cited by examiner

*Primary Examiner*—Tuan T. Nguyen
(74) *Attorney, Agent, or Firm*—Morgan Lewis & Bockius LLP

(57) ABSTRACT

One-time programmable cell and memory device having the same includes a first metal oxide semiconductor (MOS) transistor configured to form a current path between a first node and a second node in response to a read-control signal, a second MOS transistor configured to form a current path between a third node and the second node in response to a write-control signal and an anti-fuse connected between the second node and a ground voltage terminal, wherein a voltage applied to the second node is output as an output signal.

20 Claims, 7 Drawing Sheets

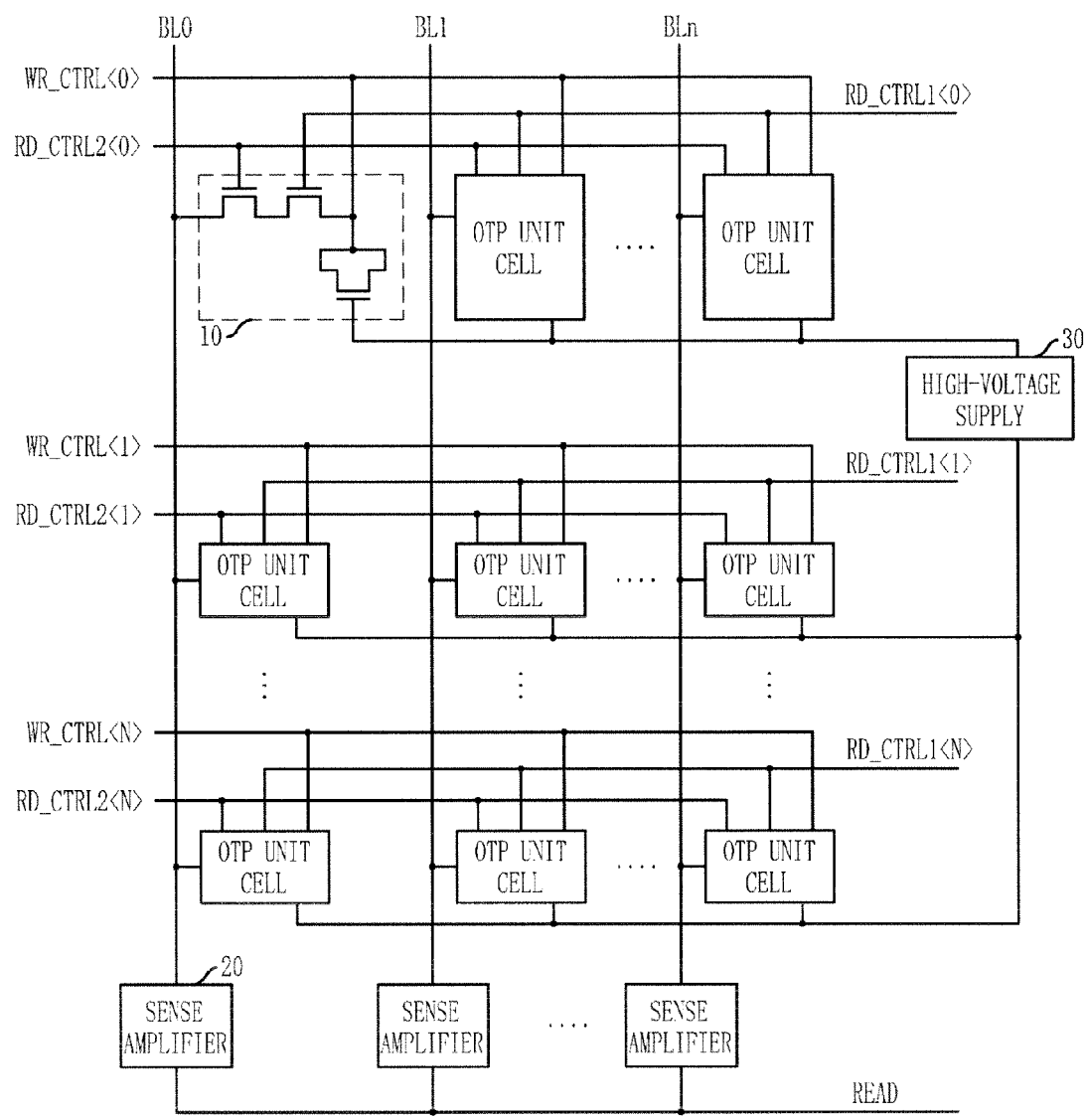

ONE-TIME PROGRAMMABLE CELL AND MEMORY DEVICE HAVING THE SAME

CROSS-REFERENCE TO RELATED APPLICATIONS

The present invention claims priority of Korean patent application number 10-2007-0016545, filed on Feb. 16, 2007, which is incorporated by reference in its entirety.

BACKGROUND OF THE INVENTION

The present invention relates to a semiconductor design technology, and more particularly, to an one-time-programmable cell having improved reliability, simple structure, reduced power consumption and a small size, and a memory device having the same.

An one-time programmable (OTP) cell is widely used for an integrated circuit (IC) chip as a single memory or a memory array. The OTP cell is especially used for marking an identification (ID), setting parameters, and controlling internal voltage level of a die or a chip. Therefore, the OTP cell and an OTP memory array greatly influence the yield and the characteristics of the IC chip.

The OTP cell and the OTP memory array are also used in an IC chip for a liquid crystal display (LCD) driver, for the same purpose as described above. The OTP cell and the OTP memory array are also used for assigning a dummy address for repairing/replacing a defective static random access memory (SRAM). Furthermore, recently, the OTP cell and the OTP memory array are frequently used for setting internal conditions of an LCD setting auto-sequence which is required by module manufacturers.

The OTP cell may be implemented with two basic states, fuse and anti-fuse.

A fuse method includes cutting a metal or poly resistance. That is, the fuse of the OTP cell is electrically short-circuited to have a minimum resistance in a normal state, but becomes open-circuited to have an infinitive resistance after cutting the metal or poly resistance. Manufacturing the OTP cell having the fuse needs a laser equipment for cutting the metal or poly resistance, and thus requires an increased manufacturing time and increased manufacturing costs. In addition, the metal or poly resistance may also be cut and short-circuited by external environments such as a temperature, which may degrade device reliability.

An anti-fuse device may be implemented with a gate oxide capacitor including a gate and a substrate of a complementary metal-oxide semiconductor (CMOS) transistor as electrodes. In a normal state, the capacitor has an infinitive resistance so that the anti-fuse is open-circuited. However, when high voltage VPP is applied to the gate or the substrate, the gate and the substrate become short-circuited so that the anti-fuse has a resistance ranging from ohms to tens of ohms. The resistance value ranging from ohms to tens of ohms indicates the gate insulation layer is broken.

As described above, in the case of the anti-fuse with a CMOS gate insulation layer, the resistance-cutting voltage is generated inside a circuit itself. Therefore, unlike the fuse method, the anti-fuse method does not need a laser equipment and is not influenced by time and temperature, which may enhance device reliability.

Hereinafter, a typical OTP cell with an anti-fuse will be described with reference to U.S. Pat. No. 6,927,997B2.

FIG. 1 is a circuit diagram of a typical OTP unit cell.

Referring to FIG. 1, the OTP cell includes an anti-fuse ANT_FS1, a switch SW1, and NMOS transistors NM1 and NM2. The anti-fuse ANT_FS1 is connected between a node A and a node B. The switch SW1 is connected between the node B and a ground voltage terminal. The NMOS transistor NM1 is connected between the node B and a node E via the NMOS transistor NM2 and has a gate connected to a node C. The NMOS transistor NM2 is connected between the source of the NMOS transistor NM1 and the node E and has a gate connected to a node D.

For reference, the NMOS transistor NM1 is a high-voltage MOS transistor for preventing a gate insulation layer of the NMOS transistor NM2 from the breakdown by the high voltage VPP.

Hereinafter, a method of writing data to and reading data from the typical OTP unit cell of FIG. 1 will be described with reference to Table 1 and FIGS. 2A and 2B.

|  | node | | | |
| --- | --- | --- | --- | --- |
| mode | A | C | D | SW1 |
| write mode | VPP | L | L | ON |
| read mode | VDD | H | H | OFF |

FIG. 2A illustrates an operation of the typical OTP unit cell of FIG. 1 in a write mode.

Referring to Table 1 and FIG. 2A, a high voltage VPP is applied to a node A. At the same time, a switch SW1 is turned on, and signals of a logic low level are applied to nodes C and D so that NMOS transistors NM1 and NM2 are turned off. Then, a current path is formed from the node A to the ground voltage terminal via the switch SW1. In other words, because a high voltage VPP is applied to a substrate and a gate of an anti-fuse ANT_FS1, the gate insulation layer is broken so that the anti-fuse ANT_FS1 may have a resistance ranging from a few ohms to tens of ohms.

FIG. 2B illustrates an operation of the typical OTP unit cell of FIG. 1 in a read mode.

Referring to Table 1 and FIG. 2B, an external voltage VDD is applied to the node A. At the same time, a switch SW1 is turned off, and signals of a logic high level are applied to the nodes C and D so that NMOS transistors NM1 and NM2 are turned on. Then, a current path is formed from the node A to the node E via the NMOS transistors NM1 and NM2.

The case when the anti-fuse ANT_FS1 is cut to output a data of a logic high level to the output node E will be described below. An external voltage VDD applied to the node A undergoes voltage drops by a resistance of from ohms to tens of ohms of the anti-fuse ANT_FS1, and by the turn-on resistances of the NMOS transistors NM1 and NM2 before being output through the node E. Because of the voltage drops at the anti-fuse ANT_FS1 and the NMOS transistors NM1 and NM2, a voltage of a level corresponding to the external voltage VDD is output through the node E.

The case when the anti-fuse ANT_FS1 is not cut so that a data of a logic low level is output to the output node E will be described below. In this case, the anti-fuse ANT_FS1 has an infinitive resistance because it is not cut. Therefore, the external voltage VDD applied to the node A undergoes voltage drops by an infinitive resistance of the anti-fuse ANT_FS1, and by the turn-on resistances of the NMOS transistors NM1 and NM2 before being output through the node E. Because of the voltage drops at the anti-fuse ANT_FS1 having an infinitive resistance, a voltage of a level corresponding to the ground voltage is output through the node E.

Though not shown in FIGS. 1 through 2B, the data output from the node E is sensed and amplified by a differential amplifier.

An OTP memory device including a plurality of the OTP unit cells of FIG. 1 will be described with reference to FIG. 3.

FIG. 3 is a block diagram of a typical OTP memory device.

Referring to FIG. 3, the OTP memory device includes a plurality of first read-control lines RD_CTRL1<0:N>, a plurality of second read-control lines RD_CTRL2<0:N>, a plurality of write-control lines WR_CTRL<0:N>, a plurality of OTP unit cells 10, a plurality of data lines BL0 to BLn, a plurality of sense amplifiers 20, and a high voltage supply 30. The first and second read-control lines RD_CTRL1<0:N> and RD_CTRL2<0:N> extend in row direction and each of them is activated when a corresponding address is applied in a read mode. The write control lines WR_CTRL<0:N> extend in row direction and each of them is activated when a corresponding address is applied in a write mode. The OTP cells 10 are connected to the respective first read-control lines RD_CTRL1<0:N>, the respective second read-control lines RD_CTRL2<0:N>, and the respective write-control lines WR_CTRL<0:N>. The data lines BL0 to BLn extend in column direction to transfer output data from the OTP unit cells 10. The sense amplifiers 20 sense and amplify data received through the respective data lines BL0 to BLn. The high voltage supply 30 applies high voltage VPP to the OTP cells 10.

For reference, the sense amplifier 20 is implemented with a differential amplifier.

The complicated process for cutting the anti-fuse to write a data may increase access time. Furthermore, use of the differential amplifier as the sense amplifier may result in an additional current consumption by a bias terminal and an increased size of the memory device.

SUMMARY OF THE INVENTION

Embodiments of the present invention are directed to providing an one-time-programmable cell having and improved reliability, simple structure, decreased power consumption and a decreased sell size, and a memory device having the same.

In accordance with an aspect of the present invention, there is provided a first metal oxide semiconductor (MOS) transistor configured to form a current path between a first node and a second node in response to a read-control signal, a second MOS transistor configured to form a current path between a third node and the second node in response to a write-control signal and an anti-fuse connected between the second node and a ground voltage terminal, wherein a voltage applied to the second node is output as an output signal.

BRIEF DESCRIPTION OF THE DRAWINGS

FIG. 3 is a block diagram of a typical OTP memory device.

DESCRIPTION OF SPECIFIC EMBODIMENTS

Hereinafter, an one-time programmable (OTP) cell and a memory device having the same in accordance with the present invention will be described in detail with reference to the accompanying drawings.

Figure 4:
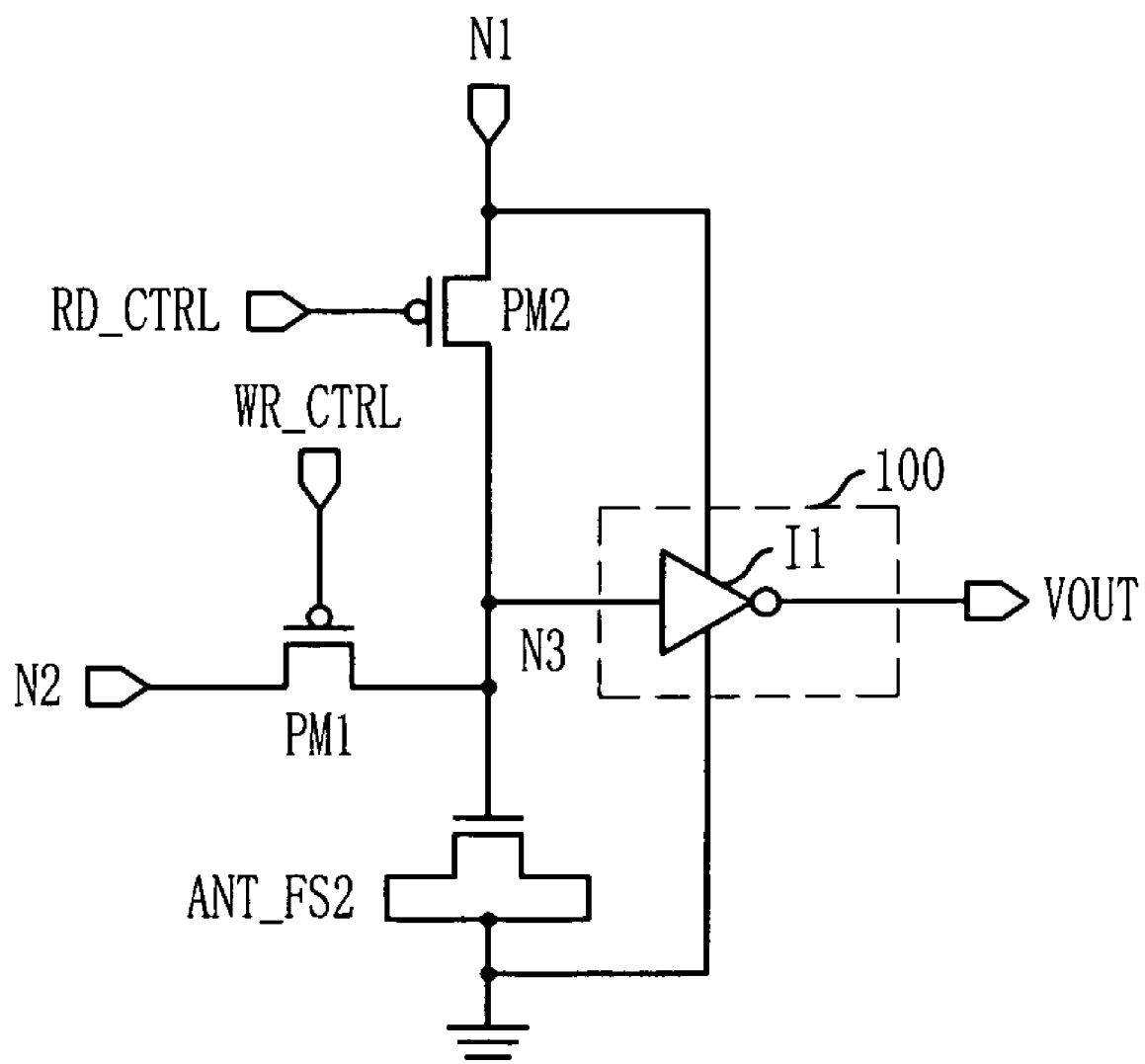
FIG. 4 is a circuit diagram of an OTP unit cell in accordance with the present invention.

FIG. 4 is a circuit diagram of an OTP unit cell in accordance with the present invention.

Referring to FIG. 4, the OTP cell includes an anti-fuse ANT_FS2 and PMOS transistors PM1 and PM2. The anti-fuse ANT_FS2 is connected between a node N3 and a ground voltage terminal. The PMOS transistor PM1 is configured to form a current path between a node N2 and a node N3 in response to a write-control signal WR_CTRL. The PMOS transistor PM2 is configured to form a current path between a node N1 and the node N3 in response to a read-control signal RD_CTRL. Finally, the OTP cell outputs a voltage of the node N3 as an output signal.

In addition, the OTP cell further includes a sense amplifier 100 of an inverter type to sense and amplify the output signal.

Figure 1:
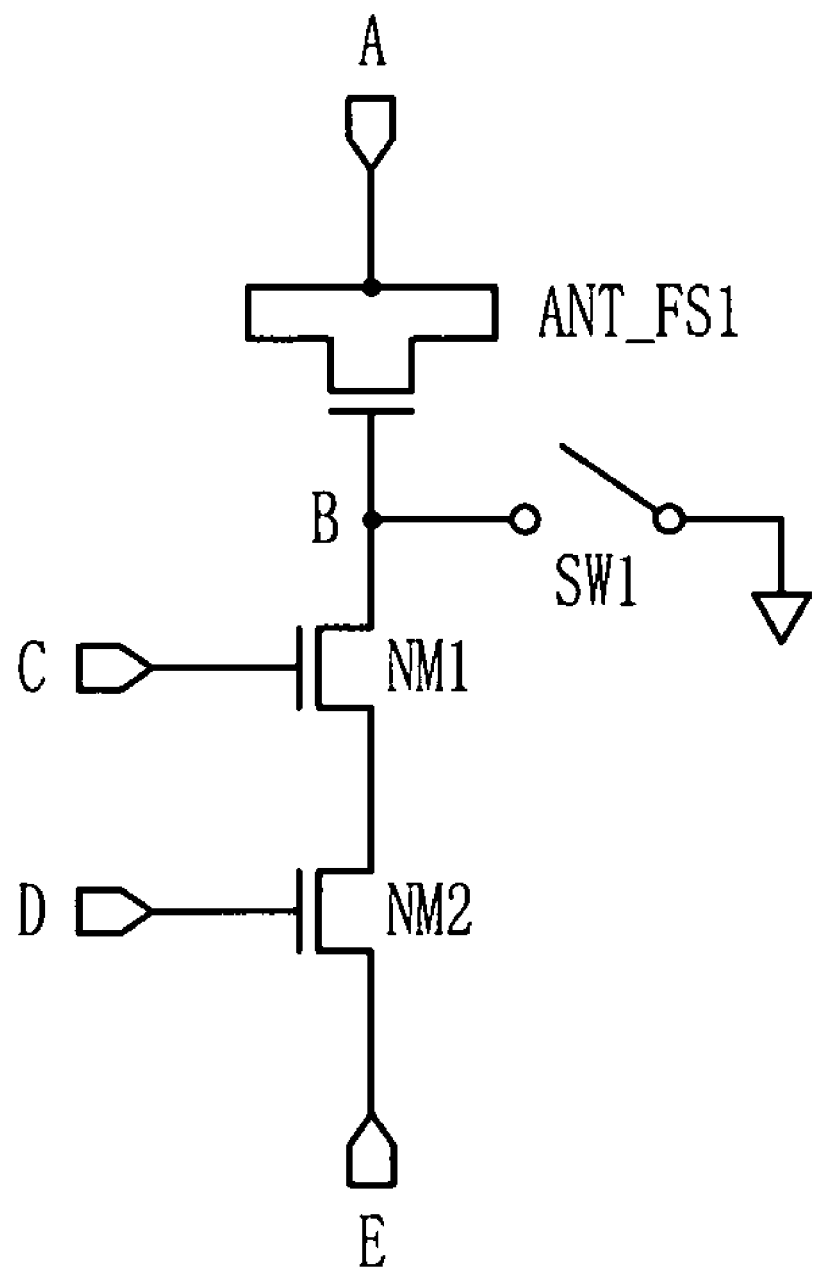
FIG. 1 is a circuit diagram of a typical one-time programmable (OTP) unit cell.
Figure 2A:
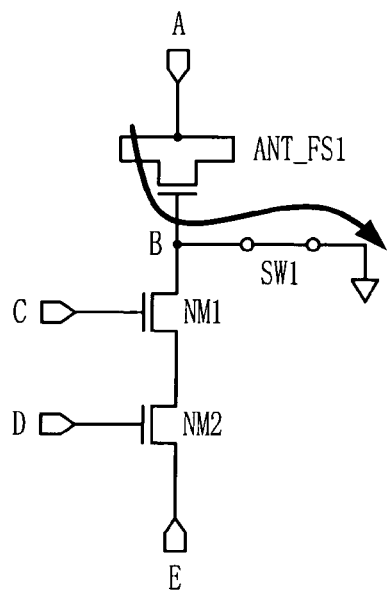
FIG. 2A illustrates an operation of the typical OTP unit cell of FIG. 1 in a write mode.
Figure 2B:
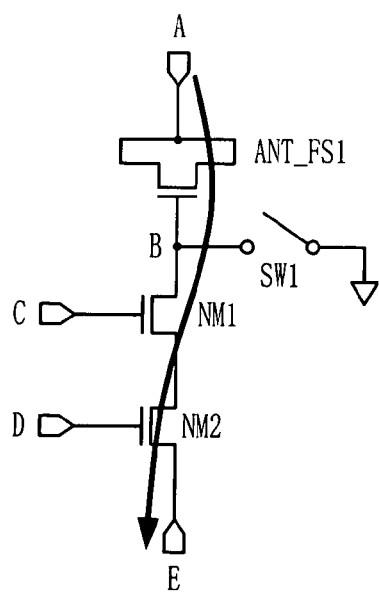
FIG. 2B illustrates an operation of the typical OTP unit cell of FIG. 1 in a read mode.

As described above, since the OTP unit cell in accordance with the embodiment of FIG. 4 needs less MOS transistors than the typical OTP unit cell of FIG. 1, the cell size can be decreased.

In addition, the sense amplifier 100 of an inverter type included in the OTP unit cell in accordance with the embodiment of FIG. 4 needs a smaller area than the differential amplifier of the typical OTP unit cell of FIG. 1. The sense amplifier 100 can reduce an access time than the differential amplifier and does not need a bias current so that power consumption can be reduced.

Furthermore, since the sense amplifier 100 of an inverter type operates in response to a voltage at the node N3, an additional current, otherwise to be used by the sense amplifier, does not need in a write mode. That is, in a write mode, a high voltage VPP can be applied to a gate of the anti-fuse ANT_FS2 without an additional current. Therefore, a high voltage of an accurate level can be applied to the gate of the anti-fuse ANT_FS2 to improve the cutting performance of the anti-fuse, thereby enhancing device reliability.

For reference, the PMOS transistors PM1 and PM2 receiving the write control signal WR_CTRL and the read control signal RD_CTRL, respectively, can be implemented with NMOS transistors. In that case, the activation logic levels of the read control signal RD_CTRL and the write control signal WR_CTRL are inverted.

Also, the PMOS transistor PM1 can be implemented with a high-voltage MOS transistor in order to prevent a breakdown caused by the high voltage.

Hereinafter, the operation of the OTP unit cell of FIG. 4 will be described with reference to Table 2 and FIGS. 5A and 5B.

| mode | node or signal | | | |
|---|---|---|---|---|
| | N1 | N2 | WR_CTRL | RD_CTRL |
| write mode | VDD | VPP | L | H |
| read mode | VDD | VPP | H | L |

Figure 5A:
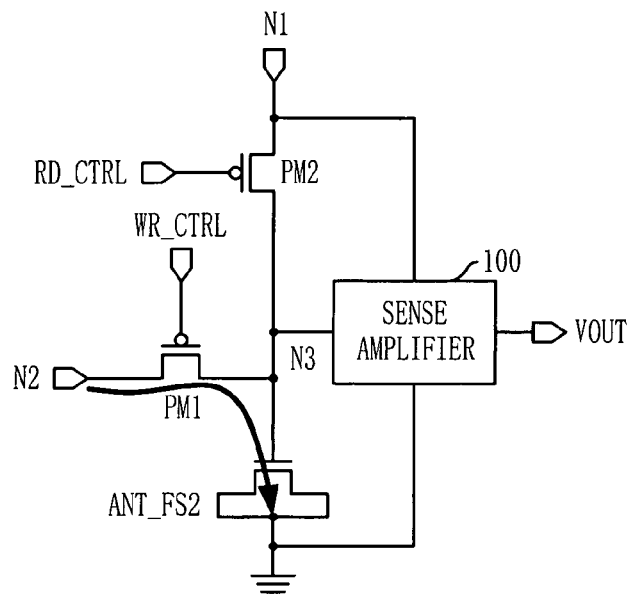
FIG. 5A illustrates an operation of the OTP unit cell of FIG. 4 in a write mode.

FIG. 5A illustrates an operation of the OTP unit cell of FIG. 4 in a write mode.

Referring to Table 2 and FIG. 5A, a high voltage VPP is applied to a node N2 and an external voltage VDD is applied to a node N1. At the same time, a write control signal WR_CTRL is activated to a logic low level and a read control signal RD_CTRL is deactivated to a logic high level.

Then, only a PMOS transistor PM1 is turned on to form a current path from the node N2 to an anti-fuse ANT_FS2, as shown in FIG. 5A. In other words, as a high voltage VPP is applied to a gate of the anti-fuse ANT_FS2 of a CMOS transistor, a gate insulation layer is broken so that the anti-fuse ANT_FS2 has a resistance ranging from ohms to tens of ohms.

Figure 5B:
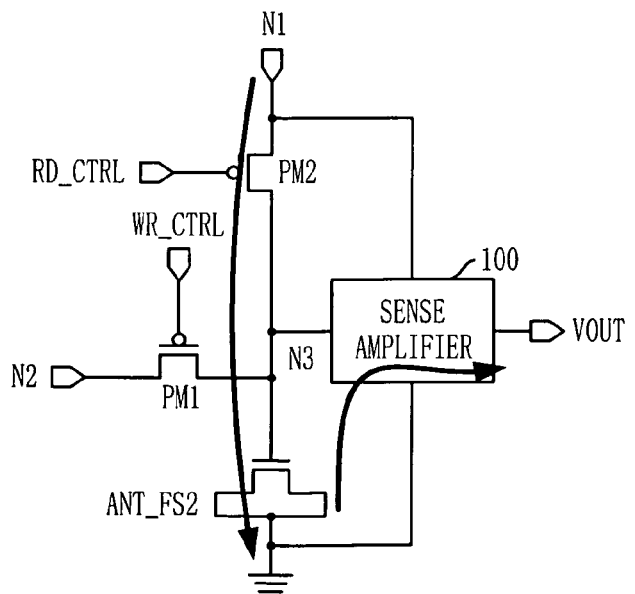
FIG. 5B illustrates an operation of the OTP unit cell of FIG. 4 in a read mode.

FIG. 5B illustrates an operation of the OTP unit cell of FIG. 4 in a read mode.

Referring to Table 2 and FIG. 5B, a high voltage VPP is applied to a node N2 and an external voltage VDD is applied to a node N1. At the same time, a write control signal WR_CTRL is deactivated to a logic high level and a read control signal RD_CTRL is activated to a logic low level. Then, only a PMOS transistor PM2 is turned on to form a current path from the node N1 to the anti-fuse ANT_FS2, as shown in FIG. 5B.

The case when the anti-fuse ANT_FS2 is cut to output a data of a logic low level to an output node N3 will be described below. In this case, because the anti-fuse ANT_FS2 has a resistance of from ohms to tens of ohms, the node N3 has a voltage level corresponding to that of a ground voltage terminal.

The case when the anti-fuse ANT_FS2 is not cut so that a data of a logic high level is output to the output node N3 will be described below. In this case, since the anti-fuse ANT_FS2 is not cut, the anti-fuse ANT_FS2 has an infinitive resistance. Therefore, because the infinitive resistance of the anti-fuse ANT_FS2 prevents formation of a current path, a voltage level at the node N3 is the same as the high voltage VPP at the node N1.

As described above with reference to FIGS. 5A and 5B, the operation of the OTP unit cell in accordance with an embodiment of the present invention is simpler than that of the typical OTP unit cell, and thus it is possible to reduce access time and current consumption.

Hereinafter, an OTP memory device having a plurality of the OTP unit cells will be described with reference to FIGS. 6 and 7.

Figure 6:
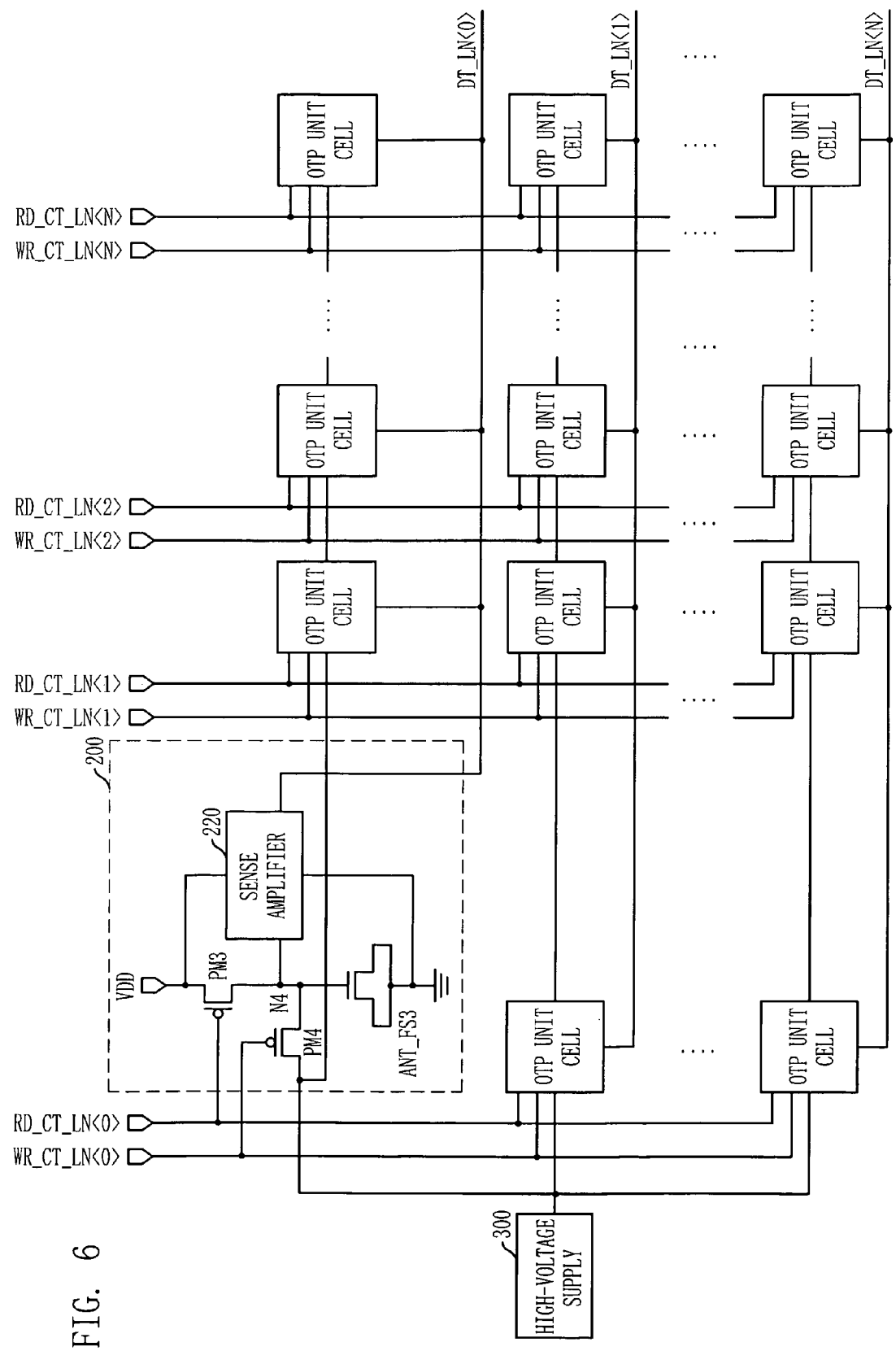
FIG. 6 is a block diagram of an OTP memory device in accordance with an embodiment of the present invention.

FIG. 6 is a block diagram of an OTP memory device in accordance with an embodiment of the present invention.

Referring to FIG. 6, the OTP memory device includes a plurality of read-control lines RD_CT_LN<0:N>, a plurality of write-control lines WR_CT_LN<0:N>, a plurality of OTP unit cells 200, a plurality of data lines DT_LN<0:N>, and a high voltage supply 300. The read-control lines RD_CT_LN<0:N> extend in column direction and each of them is activated when a corresponding address is applied in a read mode. The write-control lines WR_CT_LN<0:N> extend in column direction and each of them is activated when a corresponding address is applied in a write mode. The OTP unit cells 200 are connected to the respective read-control lines RD_CT_LN<0:N> and the respective write-control lines WR_CT_LN<0:N>. The data lines DT_LN<0:N> extend in row direction to transfer data output from the plurality of OTP unit cells.

The OTP unit cell includes PMOS transistors PM3 and PM4 and an anti-fuse ANT_FS3. The PMOS transistor PM3 is connected between an external voltage terminal VDD and a node N4, and has a gate connected to the read-control line RD_CT_LN<0>. The PMOS transistor PM4 is connected between a high voltage terminal VPP and the node N4, and has a gate connected to the write-control line WR_CT_LN<0>. The anti-fuse ANT_FS3 is connected between the node N4 and a ground voltage terminal.

The OTP unit cell further includes a sense amplifier 220 for sensing and amplifying voltage applied to a node N4 to output it to a corresponding data line DT_LN<0>.

The sense amplifier may also be shared by OTP unit cells that are connected to a common data line DT_LN<0:N>. In this case, the sense amplifier is provided to each data line DT_LN<0:N> instead of being provided to each OTP unit cell.

The operation of the OTP memory device will be described below. Here, it will be assumed that the write-control line WR_CT_LN<0> corresponding to an applied address is activated in a write mode. Then, anti-fuses NT_FS3 of a plurality of OTP unit cells that are connected to the write-control line WR_CT_LN<0> are cut.

Resultantly, if the read-control line RD_CTRL<0> corresponding to the address is activated in a read mode, the plurality of OTP unit cells connected thereto are enabled to output data of a logic low level through the corresponding data lines DT_LN<0:N>.

As described above, the operation of the OTP cells arrayed in the OTP memory device in accordance with the embodiment of the present invention as shown in FIG. 4 is simpler than that of the typical OTP cells, which may reduce access time. The simple operation may also decrease the number of read-control lines and thus area required for the read-control lines, in comparison to the typical OTP cells. Further, the sense amplifier of an inverter type for sensing and amplifying output data may reduce the required area and additional current consumption by a bias terminal of a typical differential amplifier.

Figure 7:
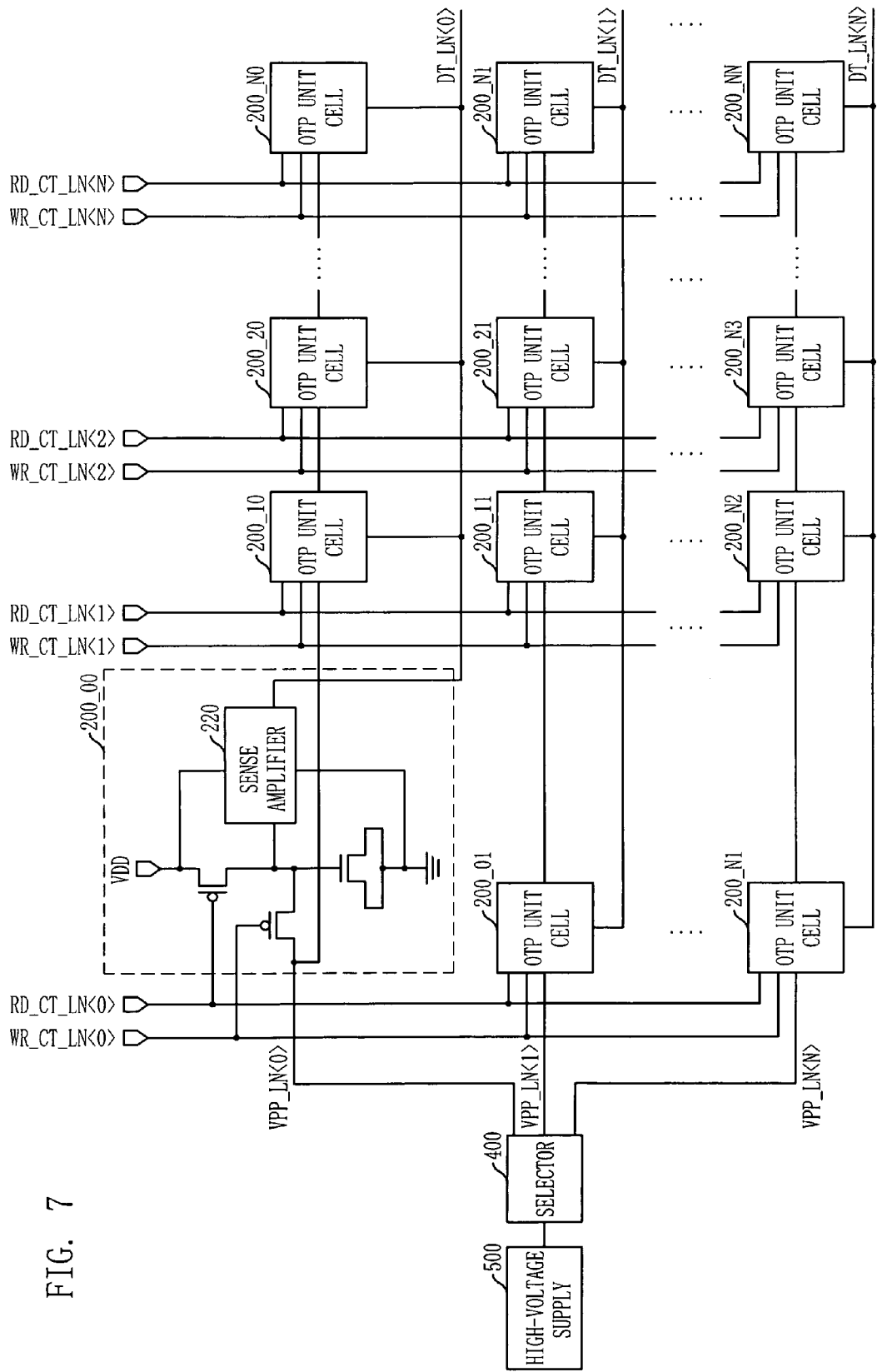
FIG. 7 is a block diagram of an OTP memory device in accordance with another embodiment of the present invention.

FIG. 7 is a block diagram of an OTP memory device in accordance with another embodiment of the present invention.

Referring to FIG. 7, the OTP memory device includes a plurality of read-control lines RD_CT_LN<0:N>, a plurality of write-control lines WR_CT_LN<0:N>, a plurality of OTP unit cells 200_00, 200_10, . . . and 200_NN, a plurality of data lines DT_LN<0:N>, a plurality of high-voltage lines VPP_LN<0:N>, a high-voltage supply 500, and a selector 400. The read-control lines RD_CT_LN<0:N> extend in column direction and each of them is activated when a corresponding address is applied in a read mode. The write-control lines WR_CT_LN<0:N> extend in column direction and each of them is activated when a corresponding address is applied in a write mode. The OTP unit cells 200_00, 200_10, . . . and 200_NN are connected to the respective read-control lines RD_CT_LN<0:N> and the respective write-control lines WR_CT_LN<0:N>. The data lines DT_LN<0:N> extend in row direction to transfer data output from the plurality of OTP unit cells.

Since the OTP unit cell has been described above with reference to FIG. 6, detailed description for it will be omitted herein.

For reference, as described above, a sense amplifier 220 may be included in the OTP unit cell or be shared by OTP unit cells that are connected to a common data line DT_LN<0:N>. In the latter case, the sense amplifier is provided to each data line DT_LN<0:N> instead of being provided to each OTP unit cell.

The operation of the OTP memory device will be described below. It will be assumed that the write-control line WR_CT_LN<0> corresponding to an applied address is activated, and the high-voltage line VPP_LN<0> is selected by the selector 400 in a write mode. Then, only the OTP unit cell 200_00 is enabled and only an anti-fuse NT_FS3 of the OTP unit cell 200_00 is cut.

Resultantly, if the read-control line RD_CT_LN<0> corresponding to the address is activated in a read mode, the OTP unit cell 200_00 is enabled so that output data of a logic low level is output through a data line DT_LN<0>.

As described above, the OTP memory device in accordance with this embodiment of the present invention activates only one OTP unit cell at a time in a write mode. Hence, it is possible to increase device reliability in comparison to the embodiment of FIG. 6.

Therefore, the OTP unit cell and the OTP memory device having the OTP unit cells in an array form in accordance with embodiments of the present invention include less MOS transistors than a typical OTP unit cell and a typical OTP memory device, providing a simpler operation and a shorter access time.

In addition, the sense amplifier of an inverter type for sensing and amplifying output data may reduce access time and additional continuous current consumption caused by a bias terminal. Furthermore, because the sense amplifier of an inverter type does not cause a leakage current while cutting the anti-fuse, it is possible to apply a high voltage of an accurate level to the anti-fuse to enhance cutting accuracy. The decrease of the current consumption and the improvement of the cutting accuracy can increase device reliability.

Because the OTP cell and the OTP memory device having the OTP cell in accordance with embodiments of the present invention include less MOS transistors than the typical OTP cell and the typical OTP memory device, it is possible to decrease a device size and an access time. In addition, because they include a sense amplifier of an inverter type, it is also possible to decrease a leakage current and a device size.

While the present invention has been described with respect to the specific embodiments, it will be apparent to those skilled in the art that various changes and modifications may be made without departing from the spirit and scope of the invention as defined in the following claims.

What is claimed is:

1. A one-time programmable cell, comprising:
   a first metal oxide semiconductor (MOS) transistor configured to form a current path between a first node and a second node in response to a read-control signal;
   a second MOS transistor configured to form a current path between a third node and the second node in response to a write-control signal; and
   an anti-fuse connected between the second node and a ground voltage terminal, wherein a voltage applied to the second node is output as an output signal.

2. The one-time programmable cell as recited in claim 1, wherein the first MOS transistor is a first PMOS transistor having a gate receiving the read-control signal, a source connected to the first node, and a drain connected to the second node.

3. The one-time programmable cell as recited in claim 1, wherein the second MOS transistor is a second PMOS transistor having a gate receiving the write-control signal, a source connected to the third node, and a drain connected to the second node.

4. The one-time programmable cell as recited in claim 2, wherein the first MOS transistor is a first NMOS transistor having a gate receiving the read-control signal, a drain connected to the first node, and a source connected to the second node, and the second MOS transistor is a second NMOS transistor having a gate receiving the write-control signal, a drain connected to the third node, and a source connected to the second node.

5. The one-time programmable cell as recited in claim 4, further comprising a sense amplifier of an inverter type to sense and amplify a voltage applied to the second node.

6. The one-time programmable cell as recited in claim 5, wherein the first PMOS transistor and the first NMOS transistor comprise a high-voltage transistor.

7. A one-time programmable memory device comprising:
   a plurality of read-control lines extending in column direction, each of the plurality of read-control lines being activated when a corresponding address is applied in a read mode;
   a plurality of write-control lines extending in column direction, each of the plurality of write-control lines being activated when a corresponding address is applied in a write mode;
   a plurality of one-time programmable unit cells, each connected to one of the plurality of read-control lines and one of the plurality of write control lines for storing data therein;
   a plurality of data lines extending in row direction to transfer data output from the plurality of one-time programmable unit cells; and
   a plurality of sense amplifiers connected to the respective data lines to sense and amplify the data transferred through the respective data lines and then to output the amplified data.

8. The one-time programmable memory device as recited in claim 7, further comprising a high-voltage supply for applying high-voltage to the plurality of one-time programmable unit cells.

9. The one-time programmable memory device as recited in claim 8, wherein the one-time programmable unit cell comprises:
   a first MOS transistor connected between an external voltage terminal and a node, and having a gate connected to the read-control line;
   a second MOS transistor connected between an output terminal of the high-voltage supply and the node, and having a gate connected to the write-control line; and
   an anti-fuse connected between the node and a ground voltage terminal, wherein a voltage applied to the node is output through the data-line.

10. The one-time programmable memory device as recited in claim 9, wherein the first MOS transistor is a first PMOS transistor having a gate connected to the read-control line, a source connected to the external voltage terminal, and a drain connected to the node; and
   the second MOS transistor is a second PMOS transistor having a gate connected to the write-control line, a source connected to the output terminal of the high-voltage supply, and a drain connected to the node.

11. The one-time programmable memory device as recited in claim 10, wherein the first PMOS transistor comprises a high-voltage CMOS transistor.

12. A one-time programmable memory device, comprising:
   a plurality of read-control lines extending in column direction, each of the plurality of read-control lines being activated when a corresponding address is applied in a read mode;
   a plurality of write-control lines extending in column direction, each of the plurality of write-control lines being activated when a corresponding address is applied in a write mode;

a plurality of one-time programmable unit cells, each connected to one of the plurality of read-control lines and one of the plurality of write-control lines for storing data therein; and a plurality of data lines extending in row direction to transfer data output from the plurality of one-time programmable unit cells.

13. The one-time programmable memory device as recited in claim 12, wherein the one-time programmable unit cell comprises:

a first MOS transistor connected between an external voltage terminal and a node, and having a gate connected to the read-control line;

a second MOS transistor connected between a high-voltage terminal and the node, and having a gate connected to the write-control line;

an anti-fuse connected between the node and a ground voltage terminal; and a sense amplifier configured to sense and amplify voltage applied to the node to output the amplified voltage to the data line.

14. The one-time programmable memory device as recited in claim 13, wherein the first MOS transistor is a first PMOS transistor having a gate connected to the read-control line, a source connected to the external voltage terminal, and a drain connected to the node; and the second MOS transistor is a second PMOS transistor having a gate connected to the write-control line, a source connected to the high-voltage terminal, and a drain connected to the node.

15. A one-time programmable memory device comprising:

first to Nth read-control lines extending in column direction, each of the read-control lines being activated when a corresponding address is applied in a read mode;

first to Nth write-control lines extending in column direction, each of the write-control lines being activated when a corresponding address is applied in a write mode;

a plurality of one-time programmable unit cells, each connected to one of the read-control lines and one of the write-control lines for storing data therein;

first to Mth data lines extending in row direction to transfer data output from the plurality of one-time programmable unit cells;

first to Mth sense amplifiers connected to the respective data lines to sense and amplify the data transferred through the respective data lines and then to output the amplified data;

first to Mth high-voltage lines extending in row direction, each of the high-voltage lines supplying high-voltage to a plurality of one-time programmable unit cells that are connected to a data line corresponding to the high-voltage line; and a selector configured to selectively supply the high-voltage to a high-voltage line corresponding to the address applied in the write mode.

16. The one-time programmable memory device as recited in claim 15, wherein the one-time programmable unit cell comprises:

a first MOS transistor connected between an external voltage terminal and a node, and having a gate connected to the read-control line;

a second MOS transistor connected between a high-voltage terminal and the node, and having a gate connected to the write-control line; and an anti-fuse connected between the node and a ground voltage terminal, and wherein a voltage applied to the node is output to the data line.

17. The one-time programmable memory device as recited in claim 16, wherein the first MOS transistor is a first PMOS transistor having a gate connected to the read-control line, a source connected to the external voltage terminal, and a drain connected to the node; and the second MOS transistor is a second PMOS transistor having a gate connected to the write-control line, a source connected to the high-voltage terminal, and a drain connected to the node.

18. A one-time programmable memory device comprising:

first to Nth read-control lines extending in column direction, each of the read-control lines being activated when a corresponding address is applied in a read mode;

first to Nth write-control lines extending in column direction, each of the write-control lines being activated when a corresponding address is applied in a write mode;

a plurality of one-time programmable unit cells connected to the respective read-control lines and the respective write-control lines for storing data therein;

first to Mth data lines extending in row direction to transfer data output from the plurality of one-time programmable unit cells;

first to Mth high-voltage lines extending in row direction, each of the high-voltage lines supplying high-voltage to a plurality of one-time programmable unit cells that are connected to a data line corresponding to the high-voltage line; and a selector configured to selectively supply the high-voltage to a high-voltage line corresponding to the address applied in the write mode.

19. The one-time programmable memory device as recited in claim 18, wherein the one-time programmable unit cell comprises:

a first MOS transistor connected between an external voltage terminal and a node, and having a gate connected to the read-control line;

a second MOS transistor connected between a high-voltage terminal and the node, and having a gate connected to the write-control line;

an anti-fuse connected between the node and a ground voltage terminal; and a sense amplifier configured to sense and amplify voltage applied to the node to output the amplified voltage to the data lines.

20. The one-time programmable memory device as recited in claim 19, wherein the first MOS transistor is a first PMOS transistor having a gate connected to the read-control line, a source connected to the external voltage terminal, and a drain connected to the node, and the second MOS transistor is a second PMOS transistor having a gate connected to the write-control line, a source connected to the high-voltage terminal, and a drain connected to the node.

* * * * *